(12) United States Patent
Dungan

(10) Patent No.: US 9,589,865 B2
(45) Date of Patent: Mar. 7, 2017

(54) POWER AMPLIFIER DIE HAVING MULTIPLE AMPLIFIERS

(71) Applicant: Avago Technologies General IP (Singapore) Pte. Ltd., Singapore (SG)

(72) Inventor: Thomas Dungan, Fort Collins, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/811,736

(22) Filed: Jul. 28, 2015

(65) Prior Publication Data

US 2017/0033031 A1 Feb. 2, 2017

(51) Int. Cl.
  *H01L 23/42* (2006.01)
  *H01L 27/095* (2006.01)
  *H01L 27/082* (2006.01)
  *H01L 25/065* (2006.01)

(52) U.S. Cl.
  CPC .......... *H01L 23/42* (2013.01); *H01L 25/0657* (2013.01); *H01L 27/082* (2013.01); *H01L 27/095* (2013.01); *H01L 2225/06548* (2013.01)

(58) Field of Classification Search
  CPC ... H01L 23/42; H01L 25/0657; H01L 27/082; H01L 27/095; H01L 2225/06548
  See application file for complete search history.

(56) References Cited

U.S. PATENT DOCUMENTS

| 6,075,995 | A | 6/2000 | Jensen |
|---|---|---|---|
| 8,314,472 | B2 | 11/2012 | Parkhurst et al. |
| 8,344,504 | B2 | 1/2013 | Wholey et al. |
| 8,536,707 | B2 | 9/2013 | Wholey et al. |
| 8,946,904 | B2 | 2/2015 | Railkar et al. |
| 2004/0261980 | A1 | 12/2004 | Dani |
| 2009/0213553 | A1 | 8/2009 | Tschirbs |
| 2011/0186992 | A1 | 8/2011 | Wu et al. |
| 2012/0049345 | A1 | 3/2012 | Railkar et al. |
| 2014/0272310 | A1 | 9/2014 | Lazur |
| 2014/0376326 | A1 | 12/2014 | Lee et al. |

FOREIGN PATENT DOCUMENTS

| EP | 0484180 A1 | 5/1992 | |
|---|---|---|---|
| GB | 2325082 A | * 11/1998 | ......... H01L 23/3677 |
| KR | 1020130072412 A | 7/2013 | |

OTHER PUBLICATIONS

"More effective cooling. With PLANSEE's heat spreaders.", available at http://www.plansee.com/en/Products-Heat-sinks-Heat-spreaders-495.htm, Heat spreader made of molybdenum-copper (MoCu), tungsten-copper (WCu) and Cu—MoCu—Cu laminates, Jan. 29, 2015, 2 pages.

(Continued)

*Primary Examiner* — Julio J Maldonado
*Assistant Examiner* — Farun Lu

(57) ABSTRACT

An apparatus, a semiconductor package including the apparatus and a method are disclosed. The apparatus includes a semiconductor die having second stages of power amplifier disposed over a module substrate. The module substrate includes a plurality of layers, pluralities of vias, and pluralities of routing layers for heat dissipation and electrical connections.

37 Claims, 10 Drawing Sheets

(56) References Cited

OTHER PUBLICATIONS

Office Action dated Apr. 4, 2016 in co-pending U.S. Appl. No. 14/806,428.
Machine translation of KR1020130072412, published Jul. 2, 2013.
Co-pending U.S. Appl. No. 14/806,428, filed Jul. 22, 2015.
"More effective cooling. With PLANSEE's heat spreaders.", available at http://www.plansee.com/en/Products-Heat-sinks-Heat-spreaders-495.htm, Heat spreader made of molybdenum-copper (MoCu), tungsten-copper (WCu) and Cu—MoCu—Cu laminates, Jul. 23, 2015.
Co-pending U.S. Appl. No. 14/799,534, filed Jul. 14, 2015.

* cited by examiner

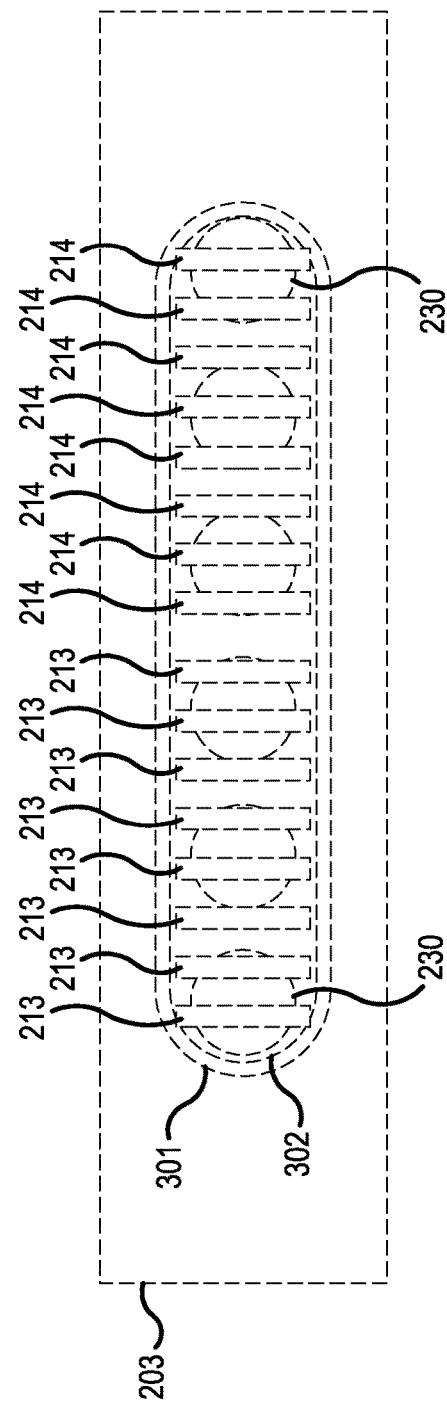

POWER AMPLIFIER DIE HAVING MULTIPLE AMPLIFIERS

BACKGROUND

Power amplifiers, to include radio frequency (RF) power amplifiers are ubiquitous in many types of communications. Packaging of power amplifiers in die form has lead to the implementation of various techniques to effect electrical connections to the semiconductor devices as well as to effect paths to dissipate heat. Often, the semiconductor devices are mounted over a printed circuit board (PCB).

Efficient heat transfer from the die through the PCB is required to remove the heat generated by the power amplifier die, which generate significant heat during operation. Moreover, differences between the coefficient of thermal expansion (CTE) mismatches between the power amplifier die and the PCB, can result in significant mechanical stress in the combined structure. As such, it is beneficial to dissipate the heat generated by the power amplifier die to improve performance and reliability of devices that incorporate the power amplifier die.

Often further exacerbating the attempts in known devices to mitigate heat, is the desired to reduce the overall size of electronic components, including power amplifier die. As such, it is desired to have better mitigation of heat in electronic structures and packages that are small compared to predecessor electronic structures and packages.

What is needed, therefore, is an apparatus that overcomes at least the shortcomings of known apparatuses described above.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

FIG. 3B shows a top view of electrical contacts of semiconductor devices of the apparatus of FIG. 3A.

DETAILED DESCRIPTION

Figure 1:
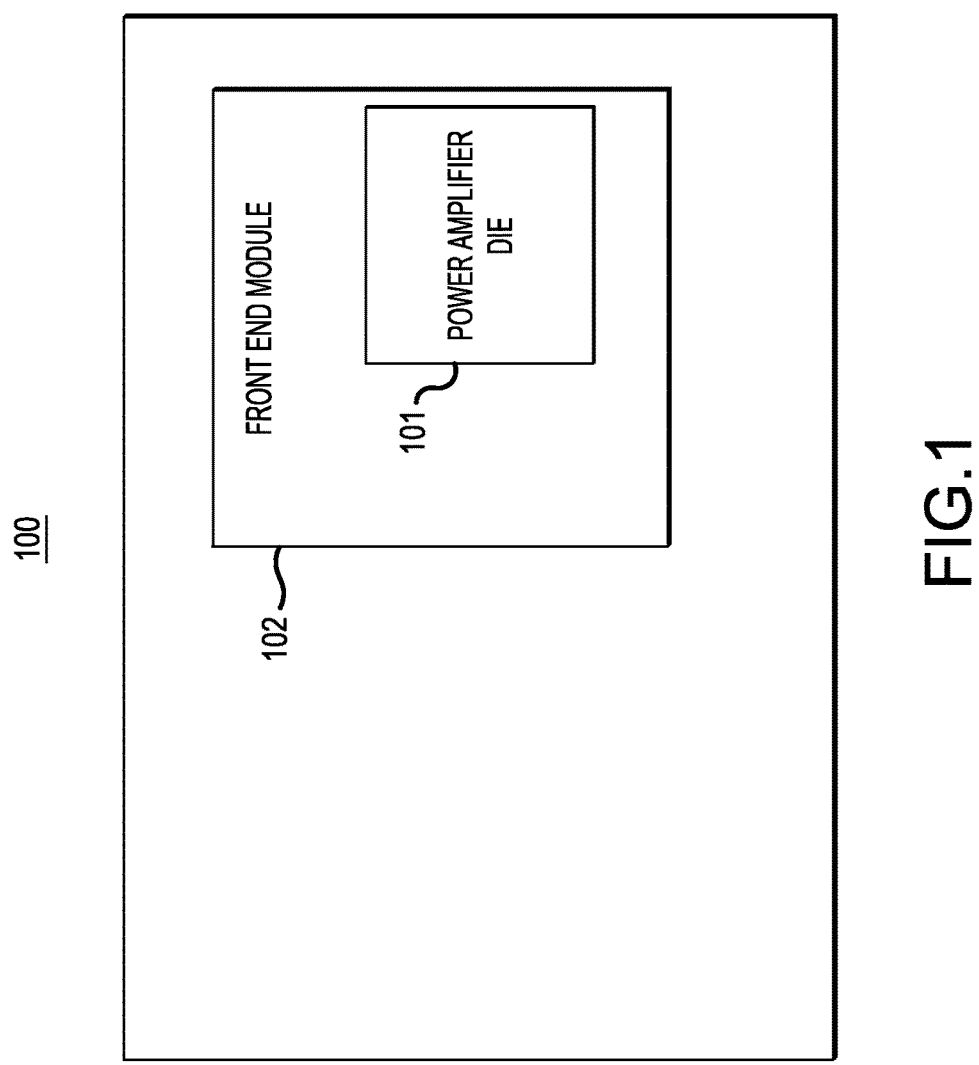
FIG. 1 is a simplified schematic block diagram of a communications device in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

As used in the specification and the appended claims, and in addition to their ordinary meaning, a power amplifier comprising a plurality of active semiconductor devices is "on" or in an "on-state" when the power amplifier is amplifying signals. By contrast, in the specification and the appended claims, and in addition to their ordinary meanings, a power amplifier comprising a plurality of active semiconductor devices is "off" or in an "off-state" when the power amplifier is not amplifying signals.

Relative terms, such as "above," "below," "top," "bottom," "upper" and "lower" may be used to describe the various elements' relationships to one another, as illustrated in the accompanying drawings. These relative terms are intended to encompass different orientations of the elements thereof in addition to the orientation depicted in the drawings. For example, if an apparatus (e.g., a semiconductor package) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

According to representative embodiments described below, an apparatus is disclosed. The apparatus comprises: a module substrate having an upper surface and a lower surface opposing the upper surface; and a contact pad disposed over the upper surface; a plurality of vias disposed in the module substrate. The vias are in thermal contact with the contact pad. The apparatus further comprises a single output stage disposed over the module substrate, and comprising: a second stage of a first power amplifier comprising a first plurality of electrical contacts, and a second stage of a second power amplifier comprising a second plurality of electrical contacts. Each of the first and second pluralities of electrical contacts being interdigitated and in contact with the contact pad. As described more fully below, the present teachings foster improved power handling in power amplification in a physically compact structure.

Certain details of the materials, structures, and devices, of the apparatuses of the present teachings are described in one or more of the following commonly owned U.S. Patents, which are specifically incorporated herein by reference: U.S. Pat. Nos. 8,946,904; 8,536,707; 8,344,504; and 8,314,472.

FIG. 1 is a simplified schematic block diagram of a communication device 100 in accordance with a representative embodiment. The communication device 100 may be, for example a mobile telephone, or similar device configured to send and receive signals in more than one communication band. Among other components, the communication device 100 comprises a power amplifier die 101 disposed in a front end module 102. Of course, the communication device 100 comprises other components well-known to one of ordinary skill in the art, which are not shown or described.

In certain representative embodiments described herein, the power amplifier die 101 is a dual frequency (e.g., dual RF) device, which is configured to operate in two distinct communications bands. Illustratively, the power amplifier die 101 comprises two power amplifiers. It is noted that the use of two power amplifiers for two communications bands is merely illustrative, and more than two power amplifiers for amplifying signals in more than two communications bands is contemplated, although routing and symmetry constraints may result in limits to the benefits of providing more than two power amplifiers.

As described more fully below, the front end module 102 comprises a module substrate (not shown in FIG. 1). The module substrate is disposed over a motherboard (not shown) of the communication device, with thermal (and electrical) connections made thereto. The front end module 102 comprising the power amplifier die 101, for example, may be over-molded and provided as a separate element of the communications device 100.

Figure 2A:
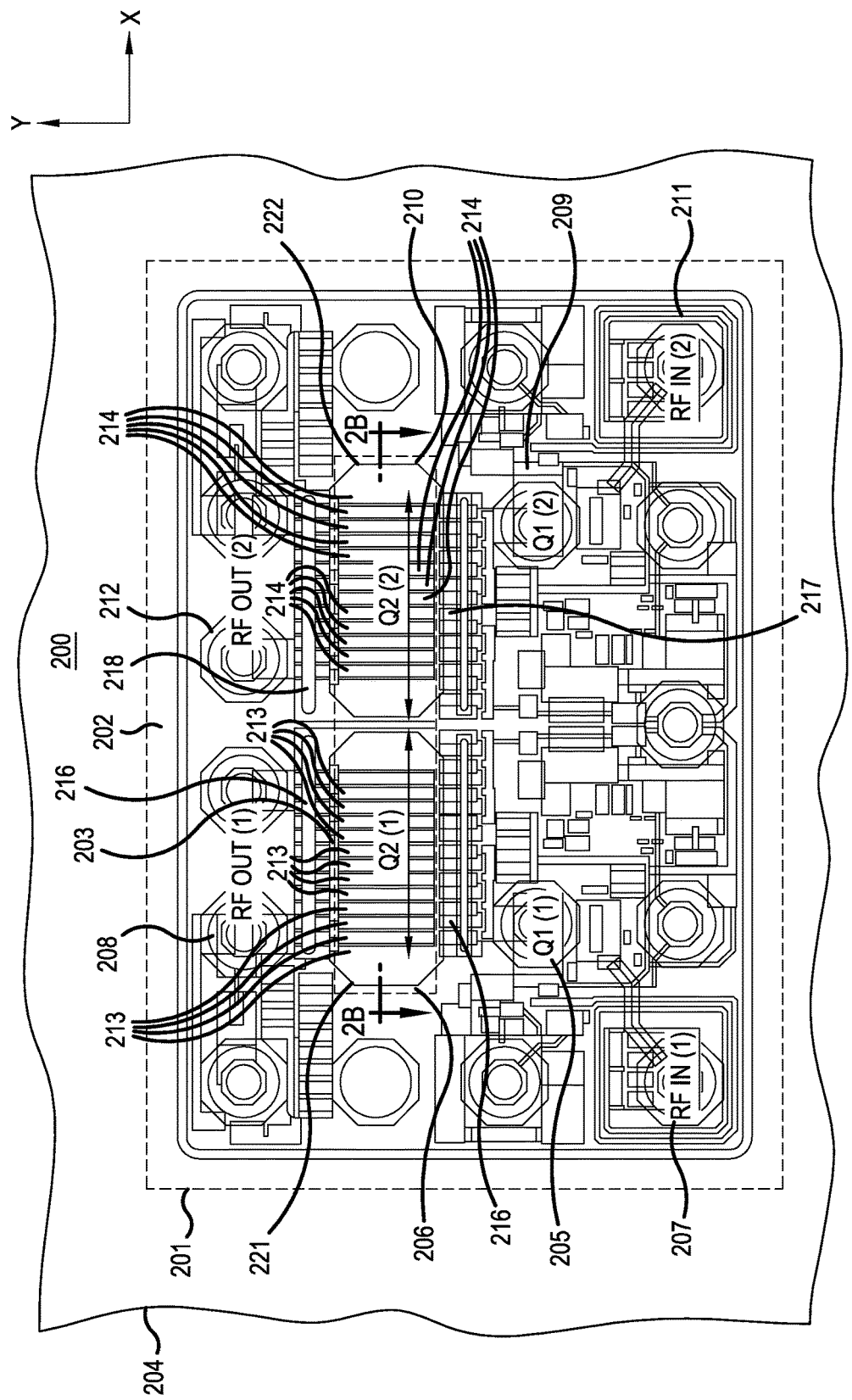
FIG. 2A shows a top view of a power amplifier die disposed over a module substrate in accordance with a representative embodiment.

FIG. 2A is a top view of an apparatus 200 in accordance with a representative embodiment. The apparatus 200 comprises a power amplifier die 201, and, as described more fully below, may be a component of communication device 100. The power amplifier die 201 is configured to amplify electromagnetic signals (e.g., radio frequency (RF) signals) over more than one communications band.

The power amplifier die 201 comprises a semiconductor substrate 202 over which and in which various components are formed or otherwise disposed. These components include, but are not limited to: a plurality of active semiconductor devices (e.g., diodes and transistors); a plurality of passive devices (e.g., thin-film resistors, inductors, and capacitors); various and sundry interconnect conductors and dielectric levels needed to connect the active and passive devices into a circuit; passivation layers which provide protection against mechanical or moisture-induced damage; and the pillars which provide mechanical, electrical, and thermal attachment of the semiconductor substrate 202 to other components. Notably, to facilitate description of the representative embodiments, the various components of the power amplifier die 201 are depicted as though the semiconductor die 201 were transparent. Moreover, not all components of the semiconductor die 201 are discussed in order to avoid obscuring the description of the present teachings.

As noted above, the power amplifier die 201 is a component of a module, such as an RF front-end module (e.g., front end module 102). By way of example, the RF front-end module may comprise amplifiers, filters, controller, and similar devices within the purview of one of ordinary skill in the art. As described more fully below, the power amplifier die 201 is disposed over a module substrate 204 of the RF front-end module.

In certain representative embodiments described herein, the power amplifier die 201 is a dual frequency (e.g., RF) device. As such, as described more fully below, the power amplifier die 201 comprises two power amplifiers. It is noted that the use of two power amplifiers for two communications bands is merely illustrative, and more than two power amplifiers for two communications bands is contemplated, although routing and symmetry constraints may result in limits to the benefits of providing more than two power amplifiers.

As described more fully below, during operation, generally, the power amplifier die 201 is used to amplify signals over only one communication band at a time. As such, while one power amplifier is in the 'on' state, the other power amplifier(s) are not amplifying signals in the other communication band(s), and is/are in the 'off' state. The present teachings utilize this aspect of the power amplifier module to improve the thermal efficiency of the RF module by structures and arrangements of representative embodiments described below.

The power amplifiers of the representative embodiment are two-stage amplifiers. A first power amplifier comprises a first stage 205 (Q1(1)) and a second stage 206 (Q2(1)). A second power amplifier comprises a first stage 209 (Q1(2)) and a second stage 210 (Q2(2)). Together, the second stages 206, 210 provide an output stage 203.

The first stage 205 receives an input signal in the first communication band at a first RF input 207. After amplification by the first and second stages 205, 206 of the first power amplifier, a first output signal is provided at a first output 208. Similarly, the first stage 209 of the second power amplifier receives an input signal in the second communication band at a first input 211. After amplification by the first and second stages 209, 210 of the second power amplifier, a second output signal is provided at a second output 212.

The second stage 206 of the first power amplifier comprises a first plurality of electrical contacts 213, and the second stage 210 of the second power amplifier comprises a second plurality of electrical contacts 214. First interstage electrical connections 215 are provided between the first stage 205 and the second stage 206 of the first amplifier; and first output electrical connections 216 are provided between the second stage 206 and the first output 208. Similarly, second interstage electrical connections 217 are provided between the first stage 205 and the second stage 210 of the second amplifier; and first output electrical connections 218 are provided between the second stage 210 and the second output 212.

Generally, but not necessarily, the power amplifier die 201 is "flip-chip" mounted over the module substrate 204, with first and second pluralities of electrical contacts 213, 214 being in direct contact with first and second contact pads 219,220, respectively. The various active devices, including the first stages 205, 209, and the second stages 206, 210 illustratively each comprise a plurality of active semiconductor devices (not shown), and may comprise passive electrical components (not shown) and circuit traces (not shown), formed in an over the semiconductor substrate 202, as noted above. Illustrative semiconductor materials for the active semiconductor device(s) include: binary semiconductor materials (e.g., Group III-V and Group IV-VI semiconductor materials); ternary semiconductor materials, silicon (Si) and silicon-germanium (SiGe); and quaternary semiconductor materials (e.g., Group III-V semiconductor materials) processed to form the active semiconductor device(s) of the output stage 203, and electrical connections thereto.

In certain representative embodiments, the active semiconductor devices that make up the first stages 205, 209, and the second stages 206, 210 of the output stage 203 comprise a heterojunction bipolar transistors (HBTs) comprising a compound of GaAs. It is emphasized that the selection of GaAs for the semiconductor material of the semiconductor substrate 202, and the selection of the HBT device are merely illustrative, and other semiconductor materials and active devices (electronic and optoelectronic) are contemplated. For example, in other representative embodiments, the active devices that make up the second stages 206, 210 of the output stage 203 comprise high electron mobility transistors (HEMTs) or pseudomorphic HEMTs (pHEMTs). Alternatively, the semiconductor material of the semiconductor substrate 202 may comprise silicon, and the active device may comprise a metal oxide semiconductor (MOS) device such as a MOS field effect transistor (MOSFET) or complementary MOS (CMOS) device. Additionally, the output stage 203 may comprise a combination of a plurality of the different active semiconductor devices to provide a desired circuit.

In the presently described representative embodiment, the first contact pad 219 is provided beneath the second stage 206 of the first power amplifier. Similarly, a second contact pad 220 is provided beneath the second stage 210 of the second power amplifier. The first plurality of electrical contacts 213 of the second stage 206 of the first power amplifier are in contact with the first contact pad 219 through a first electrically conductive pillar 221; and the second plurality of electrical contacts 214 of the second stage 210 of the second power amplifier are in contact with the second contact pad 220 through a second electrically conductive pillar 222. As will be appreciated by one of ordinary skill in the art, the first and second pluralities of electrical contacts 213, 214 are emitter contacts if the active semiconductor devices of the output stage 203 are HBTs; and are source if the active semiconductor devices are HEMTs, or pHEMTs. In either case, the first and second contact pads 219, 220 provide an electrical connection and a thermal conduction path between a output stage 203 and an electrical ground, and heat spreader according to representative embodiments of the present teachings.

Figure 2B:
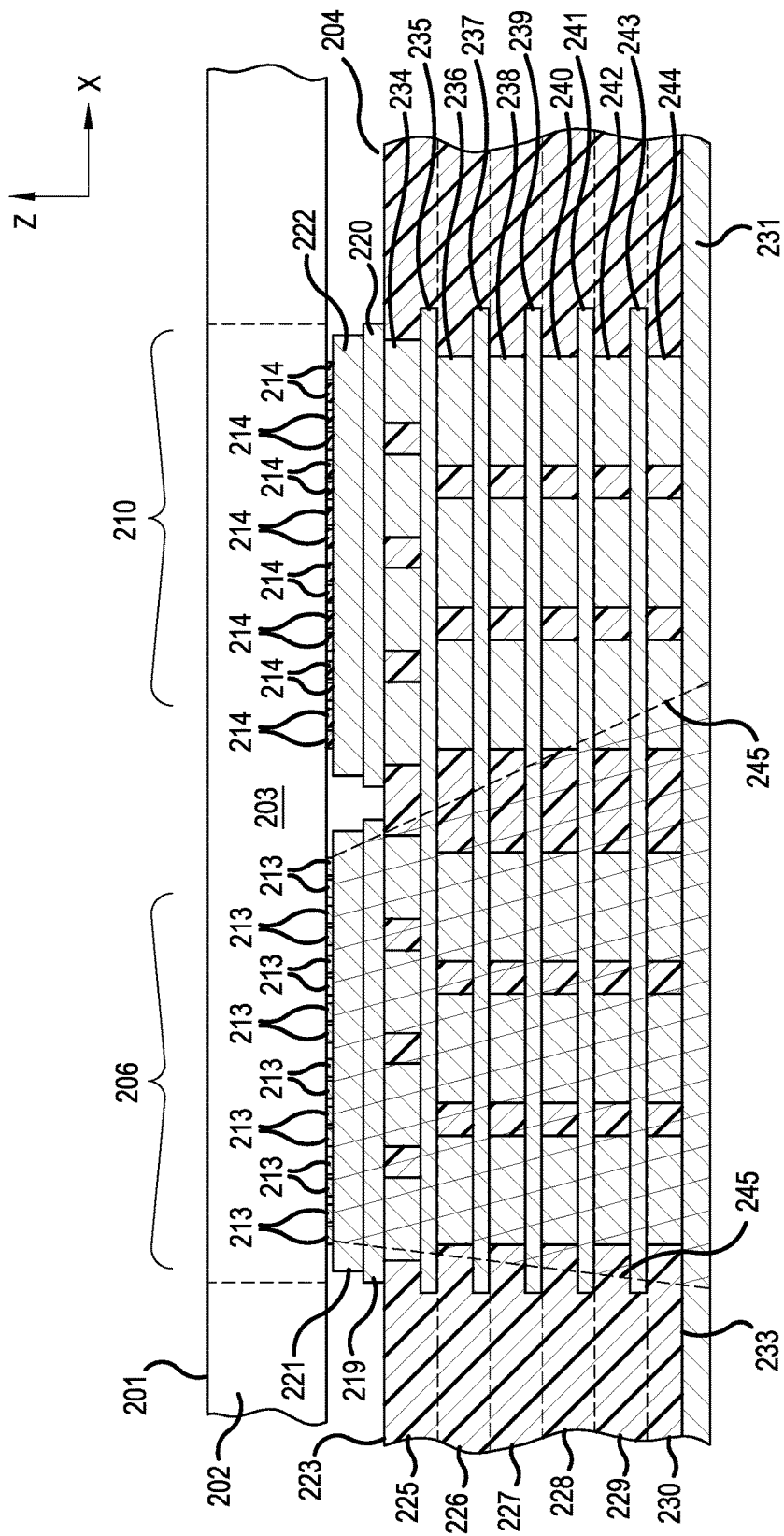
FIG. 2B shows cross-sectional view of the apparatus of FIG. 1A along the line 1B-1B

FIG. 2B shows a cross-sectional view of power amplifier die 201 taken along line 2B-2B of FIG. 2A. As depicted more clearly, the first and second pluralities of electrical contacts 213, 214 are in direct contact with the first conductive pillar 221 and the second conductive pillar 222, respectively. The first and second conductive pillar 221, 222 are in turn disposed over and in direct contact with the first and second contact pads 219, 220, respectively, which are disposed over an upper surface 223 of the module substrate 204.

The module substrate 204 comprises a first layer 225, a second layer 226, a third layer 227, a fourth layer 228, a fifth layer 229, and a sixth layer 230 (sometimes referred to collectively herein as layers 226~230). It is emphasized that the selection of six layers (layers 226~230) is merely illustrative, and that the module substrate 204 may comprise more or fewer layers than six layers. As should be appreciated, the number of layers is selected based on design considerations and input/output requirements. The principles of the module substrate 204 and the principles of its fabrication described herein are applicable to more or fewer than six layers (e.g., layers 226~230). Notably, the boundary between each of the successive layers 226~230 is distinguished in the drawing with a dashed line as shown in FIG. 2B.

A third contact pad 231 is disposed over a lower surface 233 of the sixth layer 230. Illustratively, the third contact pad 231 is connected thermally (and likely, electrically) to a heat spreader (not shown) and electrical ground, and fosters dissipation of heat, and, may be used as an electrical ground, as needed. For example, the third contact pad 231 may be disposed over a thermal (and, likely, electrical) contact with a ground (not shown) of the motherboard (not shown), or other similar component, of the communications device (e.g., cell phone) in which the power amplifier die 201 is disposed.

The first layer 225 comprises a first plurality of vias 234 disposed over a first routing layer 235. The first routing layer 235 is disposed over an upper surface (denoted by the dashed line) of the second layer 226.

The second layer 226 comprises a second plurality of vias 236 disposed over a second routing layer 237. The second routing layer 237 is disposed over an upper surface (denoted by the dashed line) of the third layer 227.

The third layer 227 comprises a third plurality of vias 238 disposed over a third routing layer 239. The third routing layer 239 is disposed over an upper surface (denoted by the dashed line) of the fourth layer 228.

The fourth layer 228 comprises a fourth plurality of vias 240 disposed over a fourth routing layer 241. The fourth routing layer 241 is disposed over an upper surface (denoted by the dashed line) of the fifth layer 229.

The fifth layer 229 comprises a fifth plurality of vias 242 disposed over a fifth routing layer 243. The fifth routing layer 243 is disposed over an upper surface (denoted by the dashed line) of the sixth layer 230.

Finally, the sixth layer 230 comprises a sixth plurality of vias 244 disposed over the third contact pad 231.

Notably, in certain representative embodiments, one or more layers may contain a single via rather than a plurality of vias. The single via is contemplated to be a comparatively large via, for example extending essentially the same length, width and depth as the plurality of vias it replaces. Further details of a contemplated single via are found in the below-referenced application to Haney, et al.

In representative embodiments, each of the first~sixth pluralities of vias 234, 236, 238, 240, 242 and 244 have a substantially circular cross-sectional shape. The radius of each of the first~sixth pluralities of vias 234, 236, 238, 240, 242 and 244 may be substantially constant, may increase, or may decrease from one side to another. In certain representative embodiments, each of the pluralities of vias are disposed in a hexagonal arrangement, as described in commonly owned co-pending U.S. patent application Ser. No. 14/799,534 entitled "Via Structures for Thermal Dissipation," to S. Haney, et al. and filed on Jul. 14, 2015. The disclosure of U.S. patent application Ser. No. 14/799,534 is specifically incorporated herein by reference. Variation in radius of the first~sixth pluralities of vias 234, 236, 238, 240, 242 and 244 may result from the laser drilling technique used to form via openings in the various layers of the module substrate 204. As such, the shape of the vias is not limited to the depicted shape. Rather, each of the first~sixth pluralities of vias 234, 236, 238, 240, 242 and 244 could have other cross-sectional shapes with substantially constant, or increasing or decreasing areal dimensions along their length. Illustratively, the first~sixth pluralities of vias 234, 236, 238, 240, 242 and 244 could have elliptical cross-sectional shapes.

Each of the first~fifth routing layers 235, 237, 239, 241 and 243, and the first, second and third contact pads 219, 220, and 231 have a substantially rectangular shape, or a substantially elliptical shape, and provide a more efficient thermal path for heat dissipation, as well as provide structural stability, and allow for electrical connections to ground to be made from electrical circuit paths (not shown in FIG. 2B).

Each of the first~sixth pluralities of vias 234, 236, 238, 240, 242 and 244 comprises a material selected to provide suitable thermal conductivity. In a representative embodiment, the material may be a thermal and electrical conductor such as copper (Cu), silver (Ag), gold (Au) or aluminum (Al), or Tungsten (W) or alloys thereof. It is emphasized that this is merely illustrative and other materials may be used for the vias. To this end, first~sixth pluralities of vias 234, 236, 238, 240, 242 and 244 may comprise any metal or alloy, or, more generally, any material that provides sufficiently high thermal and electrical conductivity, and that is suitable for fabrication of the apparatuses (e.g., semiconductor packages) of the present teachings, and their implementation. Finally, in certain representative embodiments, more than one material may be used for one or more of the first~sixth pluralities of vias 234, 236, 238, 240, 242 and 244. For example, the outer portion of a via may comprise one material (e.g., copper) and be "filled" with another material (e.g., Al), such as a damascene via structure (not shown).

Similarly, each of the first~fifth routing layers 235, 237, 239, 241 and 243, and the first, second and third and second contact pads 219, 220, and 231 may comprise any metal or alloy, or, more generally, any material that provides sufficiently high thermal and electrical conductivity, and that is suitable for fabrication of the apparatuses (e.g., semiconductor packages) of the present teachings. Generally, the first~fifth routing layers 235, 237, 239, 241 and 243, and the first, second and third contact pads 219, 220, and 231 are made of the same material(s) as the first~sixth pluralities of vias 234, 236, 238, 240, 242 and 244.

The layers 226-230 may each comprise a dielectric material or a ceramic material. Illustrative materials include, but are not limited to prepreg, so-called build-up films, polymers (including Teflon® and liquid crystal polymer (LCP)), aluminum oxide, ceramic or glass materials. As is known, build-up films comprise resin-based epoxy films with fillers, such as silica and alumina, added.

Depending on the application, a wide range of ceramic materials are also contemplated for layers 226~230. Some examples include aluminum nitride, aluminum silicate, barium neodymium titanate, barium strontium titanate (BST), barium tantalate, barium titanate (BT), beryllia, boron nitride, calcium titanate, calcium magnesium titanate (CMT), magnesium aluminum silicate, lead zinc niobate (PZN), lithium niobate (LN), magnesium silicate, magnesium titanate, niobium oxide, porcelain, quartz, sapphire, strontium titanate, silica, tantalum oxide, zirconium oxide. Electrical traces (not shown) and passive electrical components (not shown) may be provided between the layers 226~230 to provide selective electrical connections and circuits in the module substrate 204.

As depicted in FIG. 2B, the first and second contact pads 219, 220 are arranged so to have sufficient width (x-direction in the coordinate system shown) and depth (y-direction in the coordinate system shown) to ensure contact to all of the first plurality of vias 234. Similarly, the first routing layer has a width and a depth selected to ensure contact to all of the first plurality of vias 234. In this way, and described below in connection with the routing layers and pluralities of vias of each of the layers 226~230, heat generated by the output stage 203, is spread out across the various layers of the module substrate 204, and ultimately to the heat spreader to which the third contact pad 231 is thermally (and generally, electrically) connected.

The second plurality of vias 236 is connected on one side to the first routing layer 235, and on another side to the second routing layer 237. Like the first routing layer 235, the second routing layer 237 has a width and a depth selected to ensure contact to all of the second plurality of vias 236. Beneficially, providing contact pads and routing layers having sufficient areal dimensions to ensure contact with respective ones of the first~sixth pluralities of vias 234, 236, 238, 240, 242 and 244 serves to spread the heat generated by the output stage 203 across the module substrate 204, and through to the heat spreader to which the third contact pad 231 is connected.

In the representative embodiment depicted in FIG. 2B, each of the first~fifth routing layers 235, 237, 239, 241 and 243, are generally wider (x-direction) and deeper (y-direction) than the width and depth of the respective first~sixth pluralities of vias 234, 236, 238, 240, 242 and 244. Moreover, each of the first~fifth routing layers 235, 237, 239, 241 and 243, have substantially identical widths and depths (and, as such substantially identical areal dimensions). This is merely illustrative, and, as described in above-incorporated U.S. patent application Ser. No. 14/799,534 and other representative embodiments below, the widths and depths of the first~fifth routing layers 235, 237, 239, 241 and 243 may differ. Similarly, the widths and depths of the arrays of the respective first~sixth pluralities of vias 234, 236, 238, 240, 242 and 244 are substantially identical; this too is merely illustrative, as described more fully below. Notably, however, the width and depth of each of the first~sixth pluralities of vias 234, 236, 238, 240, 242 and 244 at each level are selected to ensure contact across the widths and depths of the respective first~fifth routing layers 235, 237, 239, 241 and 243. In the representative embodiment depicted in FIG. 2B, the widths and depths of the arrays of the respective first-~sixth pluralities of vias 234, 236, 238, 240, 242 and 244 are substantially identical. This is merely illustrative, as the widths and depths of the arrays of the first~sixth pluralities of vias 234, 236, 238, 240, 242 and 244 can differ as described below in connection with another representative embodiment.

As noted above, during normal operation, only one of the second stage 206 or the second stage 210 are operating (i.e., "on") at a time, since communication normally occurs only in one of the communication bands the device (e.g., cell phone), in which the apparatus is deployed, at a time. As such only one of the second stages 206, 210 is generating heat at a time. In the depicted embodiment of FIG. 2B, second stage 206 is operating at the particular time, and second stage 210, is currently "off." The heat generated is depicted as a shadowed portion 245 in FIG. 2B. As is known, in a structure such as that of FIG. 2B, heat generated by the output stage 203 tends to spread downwardly (−z direction in the depicted coordinate system shown in FIG. 2B), in a trapezoidal shape. Beneficially, however, because the portion of the heat spreader comprised of the first~fifth routing layers 235, 237, 239, 241 and 243 and the first~sixth pluralities of vias 234, 236, 238, 240, 242 and 244 beneath the second stage 210 is available to dissipate heat generated by the second stage 210. Moreover, since the second stage 210 is not generating heat at the current time, the portion of the module substrate 204 beneath the second stage 210 is "cooler" than when it is generating heat, and compared to the portion of the module substrate 204 beneath the second stage 206. As is known, a greater the volume of thermally (and, generally, electrically) conductive material lowers the thermal resistance, and improves the efficiency of heat dissipation. As such, the thermal resistance of the module substrate 204 beneath the second stage 210 is comparatively low, and dissipation of heat generated by second stage 206 is fostered. Accordingly, the power amplifier die 201 comprising the module substrate 204 depicted in FIG. 2B affords a greater volume of heat dissipating material for heat dissipation compared to known structures that have a single heat spreader for each (in this case two) power amplifier (or second stage thereof). Stated somewhat differently, by the structure of the presently described representative embodiment, each of the second stages 206, 210 has access to the entire heat spreader made up by the pluralities of vias and routing layers of the module substrate 204. Moreover, the thermal resistance of the heat spreader realized by the combination of the routing layers and pluralities of vias of representative embodiments further improves heat dissipation. Finally, it can be shown that compared to known structures that have a single heat spreader for each (in this case two) power amplifier (or second stage thereof), a greater volume of heat dissipating material can be provided in a smaller volume of substrate, thereby decreasing the so-called footprint of the power amplifier die 201 compared to known structures.

Figure 2C:
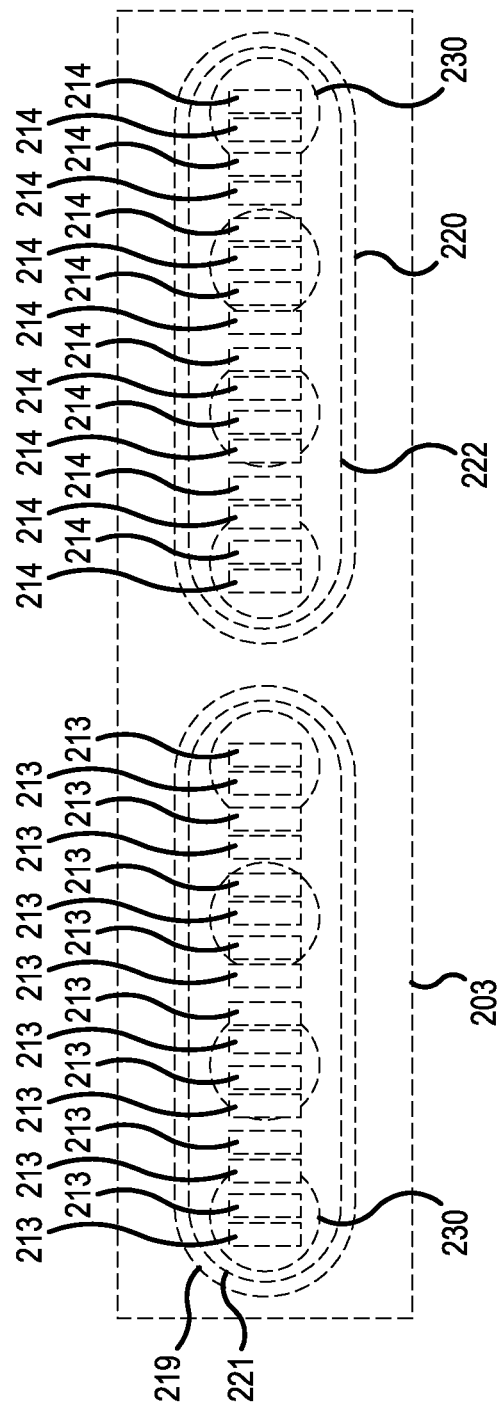
FIG. 2C shows a top view of electrical contacts of semiconductor devices of the apparatus of FIGS. 2A and 2B, in accordance with a representative embodiment.

FIG. 2C shows a top view of the first and second pluralities of electrical contacts 213, 214 of the active semiconductor devices of second stages 206, 210, respectively. As described more fully above, the first plurality of electrical contacts 213 are in direct contact with the first conductive pillar 221, and ultimately in contact with the first plurality of vias 234. Similarly, the second plurality of electrical contacts 214 are in direct contact with the second conductive pillar 222, and ultimately in contact with the first plurality of vias 234.

Figure 3A:
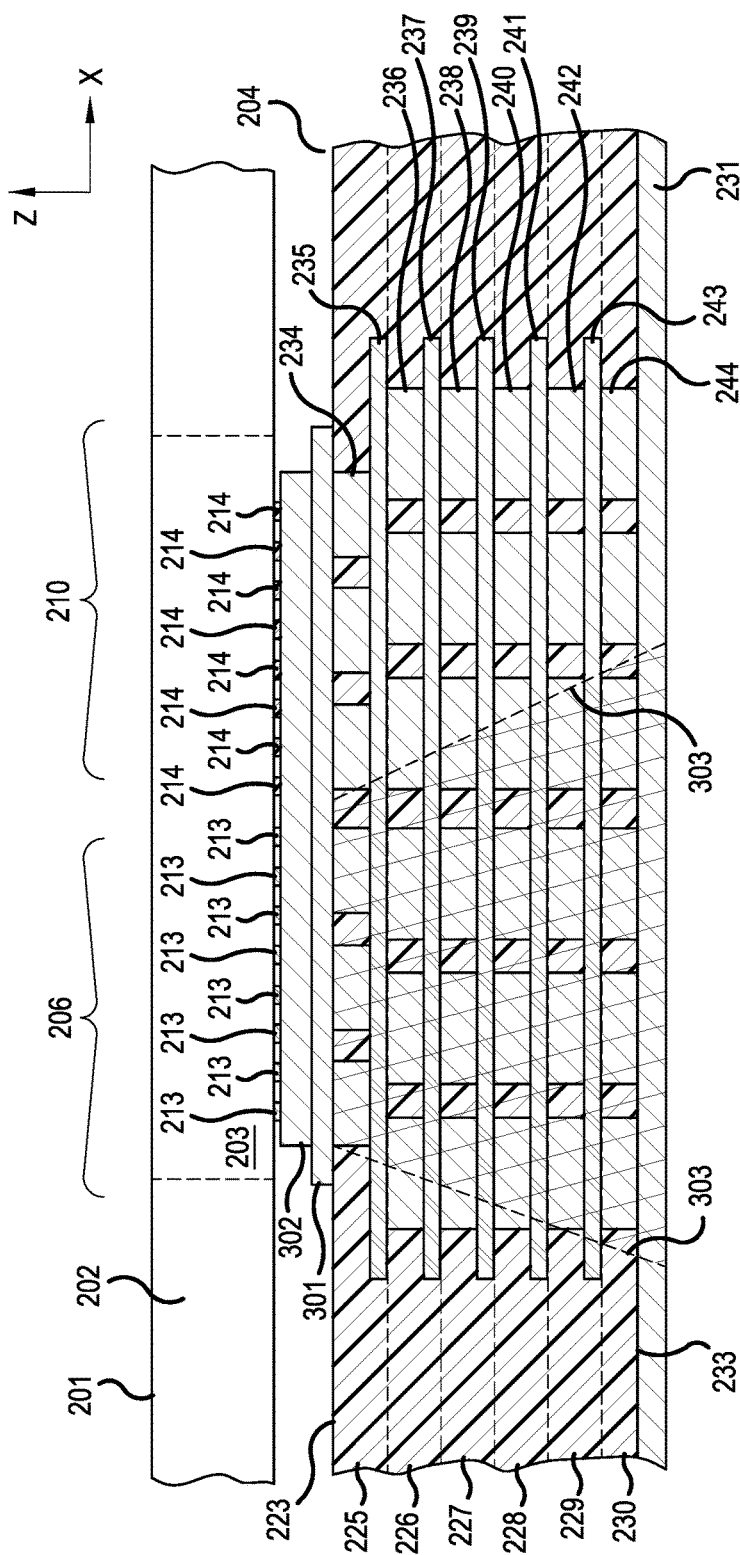
FIG. 3A shows cross-sectional view of an apparatus in accordance with a representative embodiment.

FIG. 3A shows cross-sectional view of apparatus 200 in accordance with a representative embodiment. The apparatus 200 comprises power amplifier die 201, and, as described more fully below, may be component of communication device 100.

The power amplifier die 201 comprises the semiconductor substrate 202 over which and in which various components are formed or otherwise disposed. Many aspects of the power amplifier die 201 of FIG. 3A, including components, devices, materials, and arrangements, shapes and dimensions of components are common to those described above in connection with the power amplifier die 201 described in connection with the representative embodiments of FIG. 2B above. Many details of the common features of the power amplifier die 201 described in connection with the representative embodiments of FIG. 2B are not repeated.

The module substrate 204 comprises layers 226~230; first~sixth pluralities of vias 234, 236, 238, 240, 242 and 244; first~fifth routing layers 235, 237, 239, 241 and 243; and third contact pad 231. As noted above, the layers, pluralities of vias, and routing layers may greater or fewer in number than shown, and may be provided in different arrangements than shown in FIG. 3A.

As noted above, during normal operation, only one of the second stage 206 or the second stage 210 are operating (i.e., "on") at a time, since communication normally occurs only in one of the communication bands the device (e.g., cell phone), in which the apparatus is deployed, at a time. As such only one of the second stages 206, 210 is generating heat at a time. In the depicted embodiment of FIG. 3A, second stage 206 is operating at the particular time, and second stage 210, is currently "off." As is known, in a structure such as that of FIG. 3A, heat generated by the output stage 203 tends to spread downwardly (−z direction in the depicted coordinate system shown in FIG. 3A), in a trapezoidal shape. Beneficially, however, because the portion of the heat spreader comprised of the first~fifth routing layers 235, 237, 239, 241 and 243 and the first~sixth pluralities of vias 234, 236, 238, 240, 242 and 244 beneath the second stage 210 is available to dissipate heat generated by the second stage 210. Moreover, since the second stage 210 is not generating heat at the current time, the portion of the module substrate 204 beneath the second stage 210 is "cooler" than when it is generating heat, and compared to the portion of the module substrate 204 beneath the second stage 206. As is known, a greater the volume of thermally (and, generally, electrically) conductive material lowers the thermal resistance, and improves the efficiency of heat dissipation. As such, the thermal resistance of the module substrate 204 beneath the second stage 210 is comparatively low, and dissipation of heat generated by second stage 206 is fostered.

One significant difference between the representative embodiments depicted in FIGS. 2B and 3A is the replacement of first, second and third contact pads 219, 220, and 231 with a single contact pad 301 over the upper surface 223 of the module substrate 204; and the replacement of first and second conductive pillars 221, 222 with a single conductive pillar 302. The single contact pad 301 has a width (x-direction in the coordinate system shown) and depth (y-direction in the coordinate system shown) to ensure contact to all of the first plurality of vias 234. The single contact pad 301 and single conductive pillar 302 provide a continuous layer of thermally conductive material extending across each of the first and second pluralities of electrical contacts 213, 214. By contrast a "gap" exists between the first and second contact pads 219, 220, and first and second conductive pillars 221, 222, respectively of the representative embodiments of FIG. 2B. This continuous layer of thermally conductive material provides thermal (and, likely, electrical) contact over a wider area, and ultimately, further promotes lateral transport of heat from the active devices of second stage 206 or the second stage 210 currently "on", to the portion of the heat spreader under the second stage 206 or the second stage 210, with active devices that are currently "off". Specifically, heat generated by the "on" second stage (in this case, second stage 206) can be spread across the continuous layer of thermally conductive material provided by the single conductive pillar 302 and the single contact pad 301. This heat is more evenly spread across the area of the module substrate 204 and more evenly across the volume of the first~fifth routing layers 235, 237, 239, 241 and 243 and the first~sixth pluralities of vias 234, 236, 238, 240, 242 and 244. A comparison of the shadowed portion 245 in FIG. 2B to a shadowed portion 303 of the representative embodiment of FIG. 3A reveals a greater lateral spreading of heat, and thus spreading of heat across a greater volume of thermally conductive material of the module substrate 204.

FIG. 3B shows a top view of the first and second pluralities of electrical contacts 213, 214 of the active semiconductor devices of second stages 206, 210, respectively. As described more fully above, the first and second pluralities of electrical contacts 213, 214 are in direct contact with the single conductive pillar 302, and ultimately in contact with the first plurality of vias 234.

Figure 4A:
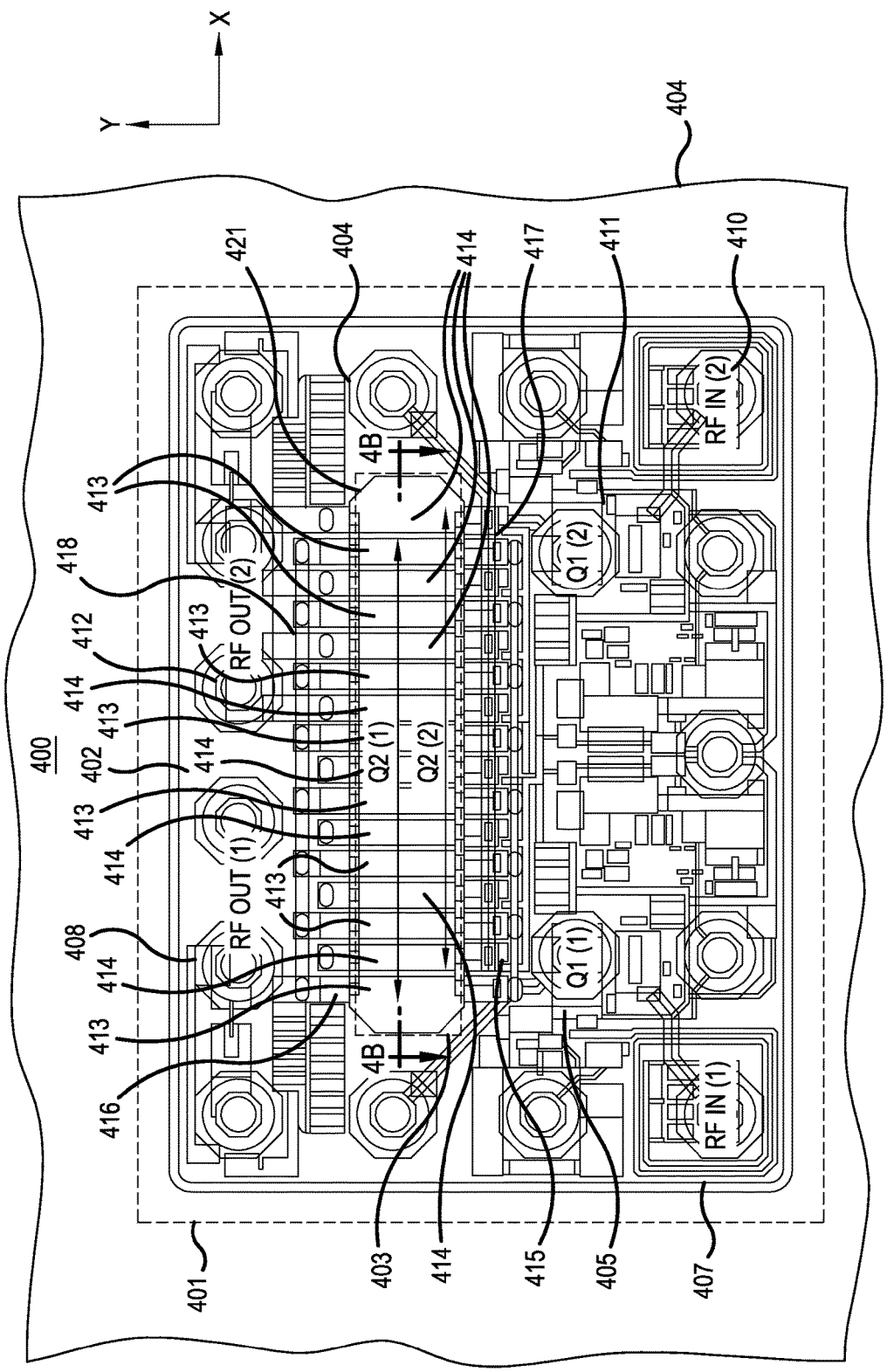
FIG. 4A shows a top view of an apparatus in accordance with a representative embodiment.

FIG. 4A is a top view of an apparatus 400 in accordance with a representative embodiment. The apparatus 400 comprises a power amplifier die 401, and, as described more fully below, may be component of communication device 100.

The power amplifier die 401 has aspects (e.g., devices and components) that are common to those of power amplifier die 201 described above in connection with FIGS. 2A-3B. Details of the common aspects may not be repeated in order to avoid obscuring the presently described representative embodiments.

The power amplifier die 401 comprises a semiconductor substrate 402 over which and in which various components are formed or otherwise disposed. These components include, but are not limited to: a plurality of active semiconductor devices (e.g., diodes and transistors); a plurality of passive devices (e.g., thin-film resistors, inductors, and capacitors); various and sundry interconnect conductors and dielectric levels needed to connect the active and passive devices into a circuit; passivation layers which provide protection against mechanical or moisture-induced damage; and the pillars which provide mechanical, electrical, and thermal attachment of the semiconductor substrate 402 to other components. Notably, to facilitate description of the representative embodiments, the various components of the power amplifier die 401 are depicted as though the semiconductor die 401 were transparent. Moreover, not all components of the semiconductor die 401 are discussed in order to avoid obscuring the description of the present teachings.

The power amplifier die 401 comprises a module substrate 404 having an upper surface 423 over which an output stage 403 (sometimes referred to below as a single output stage) is disposed. Various copper pillars are provided through the module substrate 404. Components and contacts are in thermal (and often electrical) contact with the copper pillars, which are used for heat dissipation, and in certain instances electrical connection to ground. Like module substrate 204, the module substrate 404 illustratively comprises a plurality of layers, a plurality of vias in the plurality of layers, and a plurality of routing layers in the plurality of layers.

The power amplifier die 401 is configured to amplify electromagnetic signals (e.g., radio frequency (RF) signals) over more than one communications band. Illustratively, the power amplifier die 401 is a component in communications device 100, or similar device configured to send and receive signals in more than one communication band. As described more fully below, the present teachings foster improved power handling in power amplification in a physically compact structure.

In certain representative embodiments described herein, the power amplifier die 401 is a component of a dual frequency (e.g., RF) path module, and the output stage 403 is dual frequency (e.g., RF) semiconductor die. Like power amplifier die 101, the power amplifier die 401 comprises two power amplifiers. Like power amplifier die 101, power amplifier die 401 is generally is used to amplify signals over only communication band at a time. As such, while one power amplifier is in the 'on' state, the other power amplifier(s) are not amplifying signals in the other communication band(s), and is/are in the 'off' state. Again, it is noted that the use of two power amplifiers for two communications bands is merely illustrative, and more than two power amplifiers for two communications bands is contemplated, although routing and symmetry constraints may result in limits to the benefits of providing more than two power amplifiers.

The power amplifiers of the representative embodiment are two-stage amplifiers. A first power amplifier comprises a first stage 405 (Q1(1)) and a second stage (Q2(1)), and a second power amplifier comprises a first stage 411 (Q1(2)) and a second stage (Q2(2)). Notably, the second stages are not readily discerned in FIGS. 4A and 4B.

The first stage 405 of the first power amplifier receives an input signal in the first communication band at a first RF input 407. After amplification by the first and second stages of the first power amplifier, a first output signal is provided at a first output 408. Similarly, the first stage 411 of the second power amplifier receives an input signal in the second communication band at a second RF input 410. After amplification by the first and second stages of the second power amplifier, a second output signal is provided at a second output 412.

The second stage Q2(1) of the first power amplifier comprises a first plurality of electrical contacts 413, and the second stage Q2(2) of the second power amplifier comprises a second plurality of electrical contacts 414. As shown in FIG. 4A, the first and second pluralities of electrical contacts 413, 414 are interdigitated, or alternating one to the next. As described more fully below, this interdigitation of these electrical contacts fosters distribution of heat generated by the power amplifier currently operating (i.e., in the "on" state) over the full volume of the thermally conductive components (i.e., vias and routing layers) provided in the module substrate 204. This arrangement promotes lateral transport of heat from the active devices of second stage Q1(2) or the second stage Q2(2) currently "on" over the entire expanse of the heat spreader of the vias (not shown in FIG. 4A) and routing layers (not shown in FIG. 4A) of the module substrate 404.

First input electrical connections 415 are provided between the first stage 405 and the second stage Q2(1) of the first amplifier; and first output electrical connections 416 are provided between the second stage Q2(1) and the first output 408. Similarly, second input electrical connections 417 are provided between the first stage 409 and the second stage Q2(2) of the second amplifier; and first output electrical connections 418 are provided between the second stage Q2(2) and the second output 412. As will be appreciated by one of ordinary skill in the art, the first and second input electrical connections 415, 417 are also interdigitated using an interconnect structure comprising at least three levels of metal routing layers (not shown) to effect proper electrical connections to the first and second pluralities of electrical contacts 413, 414, respectively, on the input side of the output stage 403. Similarly, the first and second output electrical connections 416, 418 are interdigitated to effect proper connections to the first and second pluralities of electrical contacts 413, 414, respectively, on the output side of the output stage 403. Like the first and second input electrical connections 415, 417, first and second output electrical connections 416, 418 are interdigitated using an interconnect structure comprising at least three levels of metal routing layers (not shown) to effect proper electrical connections to the first and second pluralities of electrical contacts 413, 414, respectively.

Figure 4B:
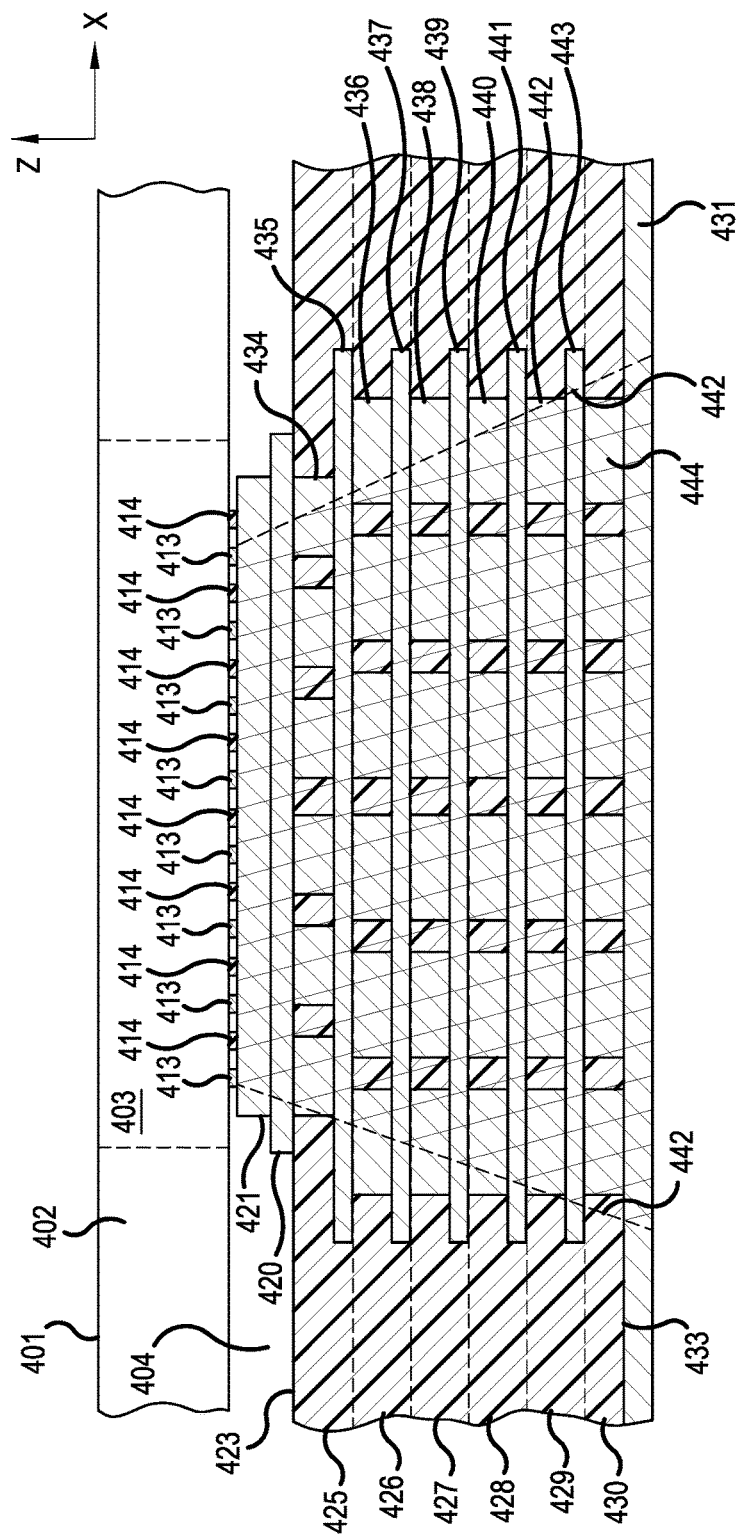
FIG. 4B shows cross-sectional view of the apparatus of FIG. 4A along the line 1B-1B.

FIG. 4B shows a cross-sectional view of power amplifier die 401 in taken along line 4B-4B of FIG. 4A. Many aspects of the power amplifier die 401, including components, devices, materials, and arrangements, shapes and dimensions of components are common to those described above in connection with the power amplifier die 401 described in connection with the representative embodiments of FIGS. 2B and 3A above. Many details of the common features of the power amplifier die 401 described in connection with the representative embodiments of FIG. 4B are not repeated.

As depicted more clearly, the first and second pluralities of electrical contacts 213, 214 of the second stages Q2(1), Q2(2) of the first and second power amplifiers are interdigitated, and are in direct contact with a (single) conductive pillar 421, which is disposed over and in direct contact with a (single) first contact pad 420. The first contact pad 420 is disposed over an upper surface 423 of a module substrate 404.

Illustratively, the first and second pluralities of electrical contacts 413, 414 are emitter contacts if the active semiconductor devices of the output stage 403 are HBTs; and are source contacts if the active semiconductor devices are HEMTs, or pHEMTs. As such, the first plurality of electrical contacts 413 are base or emitter contacts, or source or drain contacts of power transistors that are components of the second stage Q2(1) of the first power amplifier; and the second plurality of electrical contacts 414 are base or emitter contacts, or source or drain contacts of power transistors that are components of the second stage Q2(2) of the second power amplifier. As alluded to above, and as described more fully below, the interdigitation of the first and second pluralities of electrical contacts 413, 414 fosters lateral transport of heat from the active devices of second stage Q1(2) or the second stage Q2(2) currently "on" over the entire expanse of the heat spreader of the vias and routing layers of the module substrate 404. As such, distribution of heat generated by the second stages Q2(1), Q2(2) (e.g., from the power transistors thereof) is realized more evenly and symmetrically over the entire volume of thermally conductive material of the vias and routing layers of the module substrate 404. Ultimately, this allows for operation of the first and second power amplifiers of the power amplifier die 401 at lower temperatures, or in a smaller structure, or both, compared to known power amplifiers.

The module substrate 404 comprises a first layer 425, a second layer 426, a third layer 427, a fourth layer 428, a fifth layer 429, and a sixth layer 430 (sometimes referred to collectively herein as layers 425~430). It is emphasized that the selection of six layers (layers 425~430) is merely illustrative, and that the module substrate 404 may comprise more or fewer layers than six layers. As should be appreciated, the number of layers is selected based on design considerations and input/output requirements. The principles of the module substrate 404 and the principles of its fabrication described herein are applicable to more or fewer than six layers (e.g., layers 425~430). Notably, the boundary between each of the successive layers 425~430 is distinguished in the drawing with a dashed line as shown in FIG. 4B.

A second contact pad 431 is disposed over a lower surface 433 of the sixth layer 430. The second contact pad 431 is connected thermally (and likely, electrically) to a heat spreader (not shown), of, for example a motherboard (not shown) of a communication device, and fosters dissipation of heat, and, may be used as an electrical ground, as needed.

The first layer 425 comprises a first plurality of vias 434 disposed over a first routing layer 435. The first routing layer 435 is disposed over an upper surface (denoted by the dashed line) of the second layer 426.

The second layer 426 comprises a second plurality of vias 436 disposed over a second routing layer 437. The second routing layer 437 is disposed over an upper surface (denoted by the dashed line) of the third layer 427.

The third layer 427 comprises a third plurality of vias 438 disposed over a third routing layer 439. The third routing layer 439 is disposed over an upper surface (denoted by the dashed line) of the fourth layer 428.

The fourth layer 428 comprises a fourth plurality of vias 440 disposed over a fourth routing layer 441. The fourth routing layer 441 is disposed over an upper surface (denoted by the dashed line) of the fifth layer 429.

The fifth layer 429 comprises a fifth plurality of vias 442 disposed over a fifth routing layer 443. The fifth routing layer 443 is disposed over an upper surface (denoted by the dashed line) of the sixth layer 430.

Finally, the sixth layer 430 comprises a sixth plurality of vias 444 disposed over the second contact pad 431.

During operation, one power amplifier is in the 'on' state, the other power amplifier(s) are not amplifying signals in the other communication band(s), and is/are in the 'off' state. As such, during operation, at a given time, one of the first power amplifier, or the second power amplifier, is in the 'on' state; and during this time the other of the first power amplifier, or the second power amplifier, is in the 'off' state. Accordingly, the active semiconductor devices (e.g., power transistors) of one of either the second stage Q2(1) or the second stage Q2(2) is 'on' and thus, current (and heat) flows through either the first plurality of electrical contacts 413, or the second plurality of electrical contacts 414, during operation of the currently 'on' power amplifier. Similarly, while one of either the one of either the second stage Q2(1) or the second stage Q2(2) is 'on,' the other of the second stage Q2(1) or the second stage Q2(2) is 'off.' As such, the active semiconductor devices (e.g., power transistors) of either the second stage Q2(1) or the second stage Q2(2) that is 'off' while the other of the second stage Q2(1) or the second stage Q2(2) is 'on,' substantially no current (or heat) flows through the first plurality of electrical contacts 413, or the second electrical contacts 414, of the active semiconductor devices that are 'off'.

As depicted in FIG. 4B, the interdigitation of the first and second pluralities of electrical contacts 413, 414 spreads all of the first and second pluralities of electrical contacts 413, 414 more fully over the width (x-dimension in the coordinate axis of FIG. 4B) and depth (−z-dimension in the coordinate axis of FIG. 4B) of the single conductive pillar 421, the first contact pad 420, the first~fifth routing layers 435, 437, 439, 441 and 443, and the first~sixth pluralities of vias 434, 436, 438, 440, 442 and 444, than in representative embodiments described above in which the electrical contacts (e.g., first and second pluralities of electrical contacts 413, 414) of the second stages of the power amplifier die 401 are separated from one another, and not interdigitated. As noted above, because of the spreading of the first and second pluralities of electrical contacts 413, 414 a greater volume of thermally (and, generally, electrically) conductive material is available for heat dissipation. This effectively lowers the thermal resistance, and improves the efficiency of heat dissipation. As such, the thermal resistance of the module substrate 404 beneath the entire output stage 403 is comparatively low, and dissipation of heat generated by second stage in current operation is fostered. Accordingly, the power amplifier die 401 comprising the module substrate 404 depicted in FIG. 4B affords a greater volume of heat dissipating material for heat dissipation compared to known structure, and even the structures of the representative embodiments of FIGS. 2A~3B.

The increase in efficient spreading of heat across the module substrate 404 generated by the second stage in current operation (i.e., second stage Q2(1) of the first power amplifier, or the second stage Q2(2) of the second power amplifier), is readily appreciated by comparing the heat dissipated across the module substrate 404, which is depicted by the shadowed portion 445, with the shadowed portions 245 and 303 depicted above. Moreover, the heat generated by the second stage in current operation is significant more evenly distributed compared to known structures. This improvement in heat distribution allows the overall semiconductor substrate 402, the output stage 403, and the power amplifier die 401 to operate at lower temperatures than known power amplifier die, and even the power amplifier die 101 of the representative embodiments.

Operation at lower overall temperatures afforded by the interdigitation of first and second pluralities of electrical contacts 413, 414 further contributes to not only a lower thermal resistance of the module substrate 404, but also to a more symmetric distribution of heat across the module substrate 404. To this end, in the output stage 403 described above, for example, the side of the semiconductor die with the second stage 206 or the second stage 210 currently operating has a side that is closest to the non-operating second stage and a side that is farthest from the non-operating second stage. So, for example, in the representative embodiment of FIG. 3A, the second stage 206 is operating and the second stage 210 is not. In this example, the side of the second stage 206 that is closest to the second stage 210, and to a side of the output stage 203 that is currently off. Thus, this side (the right side in FIG. 3A) is closer to a side of the output stage 203 that is currently 'cooler.' Moreover, the portion of the module substrate 204 beneath the second stage 210 is also cooler compared to the portion of the module substrate 204 beneath the second stage 206. By contrast, the opposing side of the second stage 206 is immediately adjacent to a portion of the output stage 203 that is operating, and thus is comparatively hot; as is the portion of the module substrate 204 therebeneath. As can be appreciated, along the width and depth of the output stage 203 between the 'on' second stage 206 and the 'off' second stage 210, the temperature differential decreases. This differential in temperature from one side of the output stage 203 to the other results in asymmetric heat dissipation not only from the temperature differential of the output stage 203 itself, but also from the temperature differential (and therefore thermal resistance) across the substrate width (x-dimension) and depth (y-dimension). By contrast, the temperature differential across the width and depth of the output stage 403 is much less pronounced due to the interdigitation of the first and second pluralities of electrical contacts 413, 414, which more evenly spreads the heat generated by the currently operating second stage Q2(1) or Q2(2) over the entire expanse of the heat dissipating vias and routing layers of the module substrate 404. Ultimately, this results in a more symmetric heat distribution over the volume of the module substrate 404.

Figure 4C:
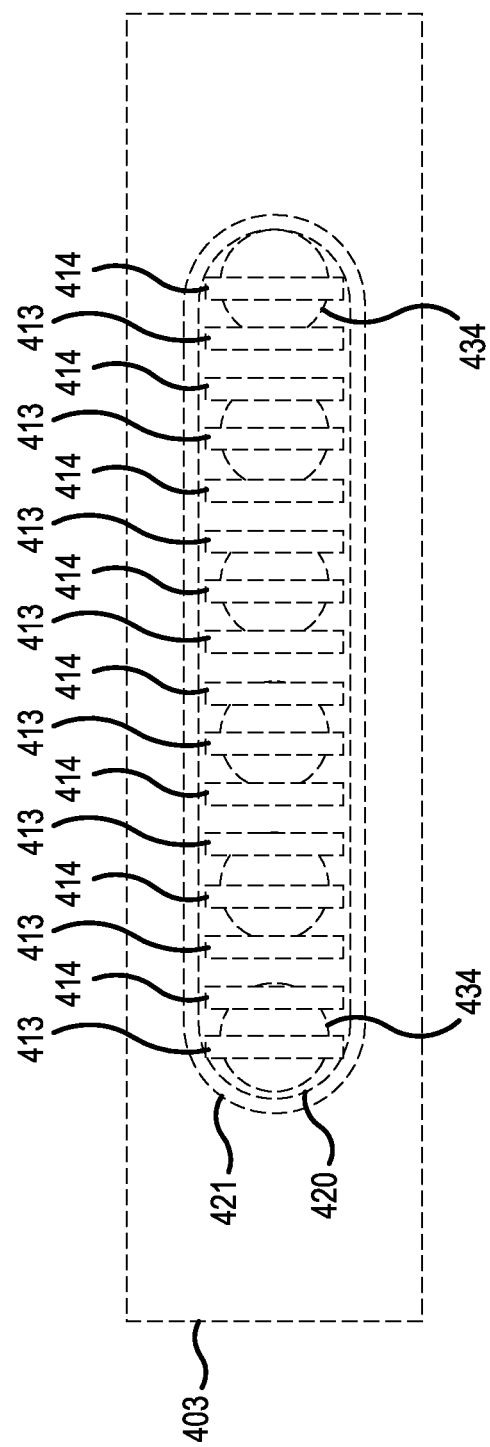
FIG. 4C shows a top view of electrical contacts of semiconductor devices of the apparatus of FIGS. 4A and 4B, in accordance with a representative embodiment.

FIG. 4C shows a top view of the first and second pluralities of electrical contacts 413, 414 of the active semiconductor devices of output stage 403. As described more fully above, the first and second pluralities of electrical contacts 413, 414 are in direct contact with the (single) conductive pillar 421, and ultimately in contact with the first plurality of vias 434.

Figure 5:
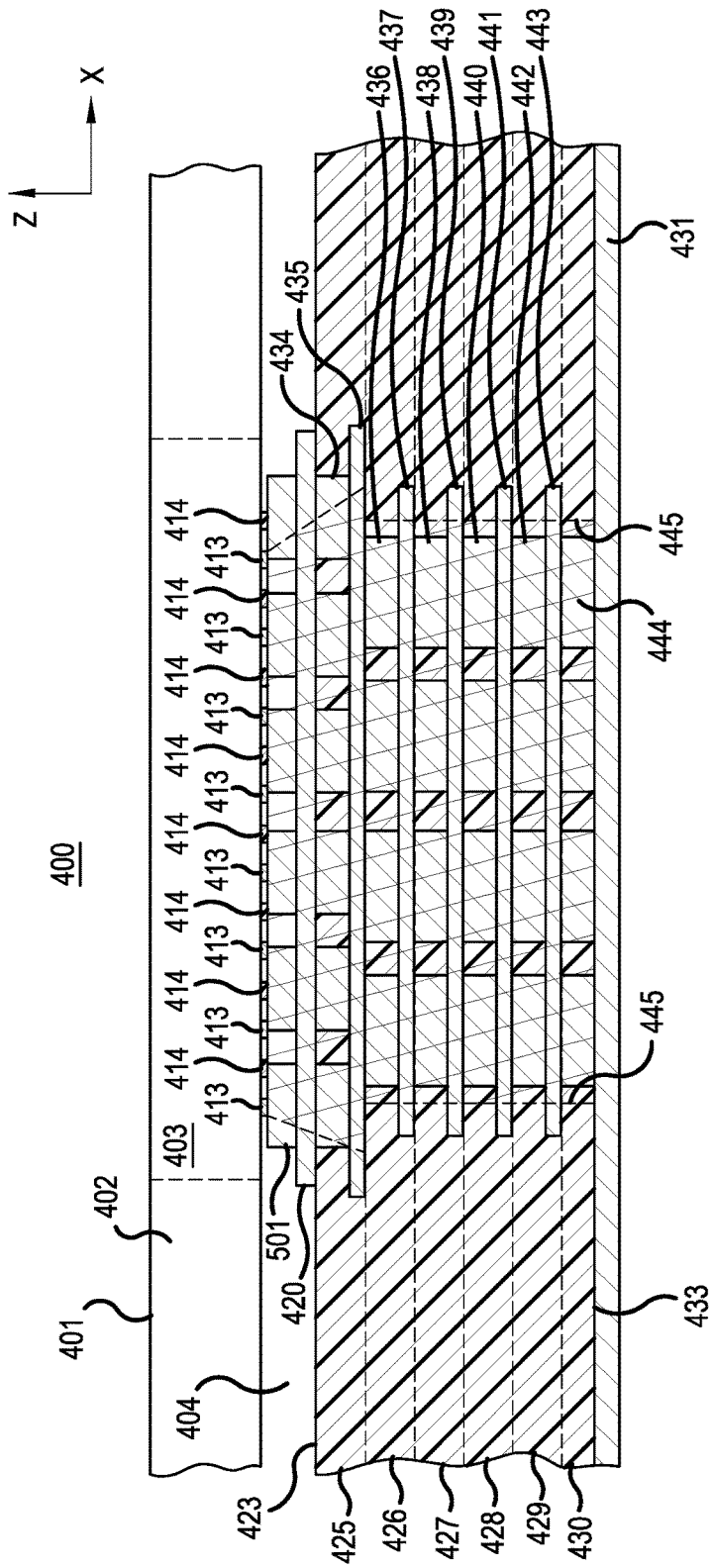
FIG. 5 shows a cross-sectional view of a semiconductor package in accordance with a representative embodiment.

FIG. 5 shows cross-sectional view of power amplifier die 401 ("apparatus") in accordance with a representative embodiment. Many aspects of the power amplifier die 401 of FIGS. 4A-4C, including components, devices, materials, and arrangements, shapes and dimensions of components are common to those described above in connection with the power amplifier die 401 described in connection with the representative embodiments of FIG. 4B above. Many details of the common features of the power amplifier die 401 described in connection with the representative embodiments of FIG. 4B are not repeated.

The module substrate 404 comprises layers 425~430; first~sixth pluralities of vias 434,436,438,440,442 and 444; first~fifth routing layers 435,437,439,441 and 443; and first and second contact pads 420, 431. As noted above, the layers, pluralities of vias, and routing layers may be greater or fewer in number than shown, and may be provided in different arrangements than shown in FIG. 4.

Notably, rather than a single conductive pillar between the output stage 403 and the first contact pad 420, a plurality of conductive pillars 501 are provided.

As should be appreciated from the present disclosure, it is useful to provide a communication device (e.g., communication device 100) that ensures that when the power amplifiers are operating at full power the peak temperatures in any of the components do not violate their reliability limits, and, beneficially in the most compact format, by efficiently spreading the heat from the power amplifiers. If the heat source on the power amplifiers can be spread more efficiently over the full volume or expanse of the heat spreader, then the overall system thermal design becomes easier. The present teachings provide various ways to provide efficient heat dissipation, with interdigitation of multiple output stages, which are not used simultaneously, providing the greatest degree of heat spreading at the source of the heat.

Notably, however, other benefits can be realized by application of the present teachings, depending on the thermal budget and the constraints and considerations of the design objectives of the communication device 100. Illustratively, the communication device 100 might be made smaller, or the costs might be reduced by allowing the substitution of a more manufacturable configuration in the module substrate or in the pillars. For example, it is often simpler to implement an array of smaller features of fixed size rather than a single large slab in a via layer through a dielectric. This pertains both to the module vias and to the pillars which connect the output stage 403 to the module substrate 404. For example, without the use of interdigitation of electrical contacts 413, 414, the thermal path in the module substrate 404 may require the use comparatively large features (of area equivalent to or larger than that of the output stage 403) rather than the more manufacturable array of first~sixth pluralities of vias 234, 236, 238, 240, 242 and 244 of the representative embodiments of FIGS. 3A~3B. Similarly, in the representative embodiments depicted in FIG. 4B and FIG. 5 differ from those of in that the single conductive pillar 421 is a single oblong pillar bar over the combined output stages, while FIG. 5 provides a plurality of conductive pillars 501 is essentially a set of smaller (more easily manufactured) pillars.

Like the representative embodiments of FIGS. 3A-3C, the first and second pluralities of electrical contacts 413, 414 of the second stages Q2(1), Q2(2) are interdigitated, affording the benefits of improved heat dissipations described above. As noted above, the improvement in heat dissipation can result in cooler operating temperatures through more efficient heat distribution, or can provide heat dissipation in a smaller volume, or both. The latter aspect is depicted in FIG. 4, with the width (x-dimension in FIG. 4) and depth (y-dimension in FIG. 4) of the second~sixth pluralities of vias 434,436,438,440,442 and 444; first~fifth routing layers 435, 437,439,441 and 443 being less than those of the representative embodiments of FIG. 3B. As such, the overall footprint of the heat spreader provided in the module substrate 204 of the representative embodiment of FIG. 4 is reduced. Notably, however, compared to known semiconductor die that include two separate heat spreaders for two separate semiconductor die having respective second stages therein, the density and number of vias and routing layers of the power amplifier die 401 of FIG. 4 is greater than that afforded by this known structure. Ultimately, the heat dissipation, represented by shadowing 445 in FIG. 4 is either more efficient than that of the known structure. Moreover, compared to the heat dissipation of the representative embodiments of FIG. 3B, the heat dissipation in the representative embodiment of FIG. 4 can be equal, depending on the heat generated by the active devices of the output stage 403. Alternatively, in certain instances when the heat dissipation is not necessarily required to be as great as in the depicted embodiment of FIG. 3B, an improvement through a reduced footprint, at an acceptable level of heat dissipation, is realized by the structure of FIG. 4.

In view of this disclosure it is noted that the various semiconductor packages and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

I claim:

1. An apparatus, comprising:
a module substrate having an upper surface and a lower surface opposing the upper surface;
a contact pad disposed over the upper surface;
a plurality of vias disposed in the module substrate, the vias being in thermal contact with the contact pad; and
an output stage comprising a second stage of a first power amplifier and a second stage of a second power amplifier, the second stage of the first power amplifier comprising a first plurality of electrical contacts, and the second stage of the second power amplifier comprising a second plurality of electrical contacts, one of the second stages being configured to be in an on-state when the other of the second stages is in an off-state, wherein each of the first and second pluralities of electrical contacts are disposed over the contact pad.

2. An apparatus as claimed in claim 1, wherein the output stage is disposed in a single semiconductor die.

3. An apparatus as claimed in claim 2, wherein the output stage comprises a plurality of a Group III-V semiconductor devices.

4. An apparatus as claimed in claim 3, wherein the Group III-V semiconductor devices comprise a heterojunction bipolar transistor (HBT), or a pseudomorphic high electron mobility transistor (pHEMT).

5. An apparatus as claimed in claim 4, wherein the first and second pluralities of electrical contacts are emitter contacts, and the single semiconductor die is flip-chip mounted over the module substrate.

6. An apparatus as claimed in claim 1, wherein the plurality of vias is a first plurality of vias disposed in a first layer of the module substrate, and the module substrate further comprises a second layer comprising a second plurality of vias.

7. An apparatus as claimed in claim 6, wherein the first plurality of vias is in direct contact with the contact pad; and the module substrate comprises a third layer comprising a third plurality of vias in direct contact with a base contact disposed over the lower surface of the module substrate.

8. An apparatus as claimed in claim 7, further comprising:
a first routing layer disposed beneath and in direct contact with each of the first plurality of vias; and
a second routing layer disposed beneath and in direct contact with each of the second plurality of vias.

9. An apparatus as claimed in claim 8, wherein the module substrate comprises at least one additional layer, comprising an additional plurality of vias.

10. An apparatus as claimed in claim 8, wherein the first routing layer has a first width and the second routing layer has a second width, which is substantially the same as the first width.

11. An apparatus as claimed in claim 8, wherein the first routing layer has a first width and the second routing layer has a second width, which is greater than the first width.

12. An apparatus as claimed in claim 6, wherein each of the first and second layers of the module substrate comprises a dielectric material.

13. An apparatus as claimed in claim 6, wherein each of the first and second layers of the module substrate comprises a ceramic material.

14. A communication device comprising the apparatus of claim 1.

15. An apparatus, comprising:
a module substrate having an upper surface and a lower surface opposing the upper surface;
a contact pad disposed over the upper surface;
a plurality of vias disposed in the module substrate, the vias being in thermal contact with the contact pad; and
a single output stage disposed over the module substrate, and comprising: a second stage of a first power amplifier comprising a first plurality of electrical contacts, and a second stage of a second power amplifier comprising a second plurality of electrical contacts, each of the first and second pluralities of electrical contacts being interdigitated and in contact with the contact pad.

16. An apparatus as claimed in claim 15, wherein the second stages each comprise Group III-V semiconductor devices.

17. An apparatus as claimed in claim 16, wherein the Group III-V semiconductor devices comprise heterojunction bipolar transistors (HBTs), or pseudomorphic high electron mobility transistors (pHEMTs).

18. An apparatus as claimed in claim 17, wherein the first and second pluralities of electrical contacts are emitter contacts, and the single output stage is flip-chip mounted over the module substrate.

19. An apparatus as claimed in claim 15, wherein the module substrate comprises a plurality of layers, and each layer comprises a plurality of vias.

20. An apparatus as claimed in claim 19, wherein the plurality of layers comprises:
a first layer comprising a first plurality of vias in direct contact with the contact pad; and
a second layer comprising a second plurality of vias in direct contact with a base contact disposed over the lower surface of the module substrate.

21. An apparatus as claimed in claim 20, further comprising:

a first routing layer disposed beneath and in direct contact with each of the first plurality of vias; and a second routing layer disposed over and in direct contact with each of the second plurality of vias.

22. An apparatus as claimed in claim 21, wherein the plurality of layers further comprises at least one additional layer.

23. An apparatus as claimed in claim 21, wherein the first routing layer has a first width and the second routing layer has a second width, which is substantially the same as the first width.

24. An apparatus as claimed in claim 21, wherein the first routing layer has a first width and the second routing layer has a second width, which is greater than the first width.

25. An apparatus as claimed in claim 19, wherein each of the plurality of layers comprises a dielectric material.

26. An apparatus as claimed in claim 19, wherein each of the plurality of layers comprises a ceramic material.

27. A communication device comprising the apparatus as claimed in claim 15.

28. An apparatus, comprising:
a module substrate having an upper surface and a lower surface opposing the upper surface;
a first contact pad disposed over the upper surface;
a second contact pad disposed over the upper surface;
a first plurality of vias disposed in a first layer of the module substrate, the first plurality of vias being in thermal contact with the first contact pad and the second contact pad, or both;
a single output stage comprising: a second stage of a first power amplifier comprising a first plurality of electrical contacts in contact with the first contact pad; and a second stage of a second power amplifier comprising a second plurality of electrical contacts in contact with the second contact pad;
a routing layer disposed beneath the first plurality of vias and in direct contact with the first plurality of vias; and
a second plurality of vias disposed in a second layer of the module substrate and beneath the routing layer, the second plurality of vias being in direct contact with the routing layer.

29. An apparatus as claimed in claim 28, wherein the second stages each comprise Group III-V semiconductor devices.

30. An apparatus as claimed in claim 29, wherein the Group III-V semiconductor devices comprise a heterojunction bipolar transistors (HBTs), or a pseudomorphic high electron mobility transistors (pHEMTs).

31. An apparatus as claimed in claim 30, wherein the first and second pluralities of electrical contacts are emitter contacts, and the single output stage is flip-chip mounted over the module substrate.

32. An apparatus as claimed in claim 28, wherein the routing layer is a first routing layer, and the apparatus further comprises:
a second routing layer disposed beneath and in direct contact with each of the second plurality of vias.

33. An apparatus as claimed in claim 32, wherein the each of the first and second layers further comprises at least one additional layer, and each additional layer comprises a respective additional plurality of vias.

34. An apparatus as claimed in claim 32, wherein the first routing layer has a first width and the second routing layer has a second width, which is substantially the same as the first width.

35. An apparatus as claimed in claim 32, wherein the first routing layer has a first width and the second routing layer has a second width, which is greater than the first width.

36. An apparatus as claimed in claim 33, wherein each of the first and second layers comprises a dielectric material.

37. An apparatus as claimed in claim 33, wherein each of the first and second layers comprises a ceramic material.

* * * * *